United States Patent
Lee et al.

(10) Patent No.: US 10,101,428 B2
(45) Date of Patent: Oct. 16, 2018

(54) METHOD AND MAGNETIC RESONANCE APPARATUS FOR GENERATING AT LEAST ONE COMBINATION IMAGE DATASET

(71) Applicant: Siemens Aktiengesellschaft, Munich (DE)

(72) Inventors: Kuan Jin Lee, Singapore (SG); Dominik Paul, Bubenreuth (DE); Mario Zeller, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 501 days.

(21) Appl. No.: 14/823,372

(22) Filed: Aug. 11, 2015

(65) Prior Publication Data

US 2016/0041249 A1 Feb. 11, 2016

(30) Foreign Application Priority Data

Aug. 11, 2014 (DE) .......................... 10 2014 215 896

(51) Int. Cl.
*G01V 3/00* (2006.01)
*G01R 33/561* (2006.01)
(Continued)

(52) U.S. Cl.
CPC ........ *G01R 33/5611* (2013.01); *G01R 33/483* (2013.01); *G01R 33/4816* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS 5,633,585 A 5/1997 Kuhn
2006/0284812 A1 12/2006 Griswold et al.
(Continued)

FOREIGN PATENT DOCUMENTS

DE 101 26 078 A1 10/2002

OTHER PUBLICATIONS

Jakob, et al.: "AUTO-SMASH: A self-calibrating technique for SMASH imaging", Magnetic Resonance Materials in Physics, Biology and Medicine, vol. 7, pp. 42-54, (1998).
(Continued)

*Primary Examiner* — Giovanni Astacio-Oquendo
*Assistant Examiner* — Raul Rios Russo
(74) *Attorney, Agent, or Firm* — Schiff Hardin LLP (57) ABSTRACT

In a method and apparatus for generating a magnetic resonance (MR) image MR data are acquired from a subject as datasets in parallel with multiple RF coils, with first parallel dataset being acquired with a first parameter set and at least one further parallel dataset being acquired with a second parameter set. A first intermediate image dataset and at least one further intermediate image dataset are reconstructed with at least one of (a) the first intermediate image dataset being reconstructed from said first parallel dataset using a calibration data item derived from said at least one further parameter set, and (b) said at least one further intermediate image dataset is reconstructed from said at least one further parallel dataset using a calibration data item derived from said first parameter set. A combination image dataset is generated by combining said first intermediate image dataset and said at least one further intermediate dataset.

18 Claims, 5 Drawing Sheets

(51) Int. Cl.
  *G01R 33/483* (2006.01)
  *G01R 33/48* (2006.01)
  *G01R 33/24* (2006.01)
  *G01R 33/389* (2006.01)
  *G01R 33/387* (2006.01)
  *G01R 33/28* (2006.01)
  *G01R 33/56* (2006.01)

(52) U.S. Cl.
  CPC ..... *G01R 33/4818* (2013.01); *G01R 33/4828* (2013.01); *G01R 33/4833* (2013.01); *G01R 33/246* (2013.01); *G01R 33/28* (2013.01); *G01R 33/387* (2013.01); *G01R 33/389* (2013.01); *G01R 33/4835* (2013.01); *G01R 33/4838* (2013.01); *G01R 33/5607* (2013.01)

(58) Field of Classification Search
  CPC ............ G01R 33/4826; G01R 33/4828; G01R 33/483; G01R 33/4831; G01R 33/4833; G01R 33/4835; G01R 33/4836; G01R 33/4838; G01R 33/387; G01R 33/246; G01R 33/38
  USPC ................................................ 324/300–322
  See application file for complete search history.

(56) References Cited

U.S. PATENT DOCUMENTS

| | | | |
|---|---|---|---|
| 2008/0024132 A1 | 1/2008 | Brau et al. | |
| 2009/0092303 A1 | 4/2009 | Griswold et al. | |
| 2010/0308824 A1* | 12/2010 | Grady | G01R 33/5611 324/309 |
| 2011/0044524 A1* | 2/2011 | Wang | G01R 33/54 382/131 |
| 2012/0081114 A1* | 4/2012 | Weller | G01R 33/5611 324/309 |
| 2013/0119985 A1* | 5/2013 | Lin | G01R 33/4818 324/309 |

OTHER PUBLICATIONS

Heidemann. et al.: "Variable Density AUTO-SMASH Imaging", in: Proceedings of the eight Scientific Meeting of the International Society of Magnetic Resonance in Medicine, p. 274, (2000).

Pruessmann, et al.: "SENSE: Sensitivity encoding for Fast MRI", Magn. Reson. Med., vol. 42, pp. 952-962, 1(999).

Sodickson, et al: "Simultaneous Acquisition of Spatial Harmonics (SMASH) Fast Imaging with Radiofrequency Coil Arrays", in: Magnetic Resonance in Medicine, vol. 38, pp. 591-603, (1997).

* cited by examiner

METHOD AND MAGNETIC RESONANCE APPARATUS FOR GENERATING AT LEAST ONE COMBINATION IMAGE DATASET

BACKGROUND OF THE INVENTION

Field of the Invention

The invention relates to a method for generating at least one combination image dataset from at least two parallel datasets, of the type wherein a coil array is used to record the parallel datasets, with a raw dataset being acquired with each coil of the coil array during a parallel recording of measuring signals and the raw datasets of a parallel recording forming a parallel dataset and with the raw datasets each containing a reduced dataset and at least one calibration data item.

Description of the Prior Art

It is known that a number of image datasets acquired using a magnetic resonance system can be combined to form a combination image dataset. For example, two image datasets recorded with different echo times can be combined to form a water image or a fat image. This so-called Dixon technique can therefore be used for water or fat suppression. The echo times of the image datasets, which are otherwise recorded using identical parameter sets, can be selected in such a manner that the water and fat spins are sometimes "in-phase" and sometimes "out-of-phase".

It is also known that T1, T2, and T2* maps can be recorded, with image datasets with varying echo times being fitted in the T2 and T2* maps, while the repetition time is changed between the image datasets in the T1 maps. The combination image dataset is obtained here by way of an exponential fit.

In this process individual image datasets can be recorded successively, they can be recorded segmented or even line by line in k-space. At the end of the data acquisition, the k-space lines associated with an image dataset are assigned to it and the combination image dataset is determined from the image datasets.

A number of data recording sequences are thus available in each instance. For example both gradient echo-based and spin echo-based sequences are known for recording T1 maps. With the Dixon technique any sequences such as FLASH, spin echo or turbo spin echo, also referred to as RARE, can be used, as long as two different echo times can be implemented.

It is also known that measuring signals can be recorded at the same time with a number of coils, in order thus to shorten measuring time. These methods are known as PPA or partial parallel acquisition. Only some of the measuring signals required to reconstruct an image dataset are recorded but with a number of coils in each instance. These coils form what is known as a coil array. If the measuring signals acquired with a single coil are used for reconstruction, under-sampling results in what is known as aliasing or foldover artifact. Each coil therefore records a reduced dataset.

A number of reconstruction methods are known for obtaining a single artifact-free dataset from these reduced datasets. Such basic reconstruction methods are known by the acronyms GRAPPA (GeneRalized Autocalibrating Partially Parallel Acquisition), SENSE (SENSitivity Encoding for fast MRI) and SMASH (SiMultaneous Acquisition of Spatial Harmonics). Modifications are also known, which are described in conjunction with the basic reconstruction methods.

With the reconstruction method SENSE (SENSE: sensitivity encoding for fast MRI. Pruessmann K P, Weiger M, Scheidegger M B, Boesiger P, Magn Reson Med., 42(5), 952-62, 1999) coil sensitivities are measured in order to determine a pseudoinverse matrix therefrom. A single overall image with or without significantly reduced aliasing artifact is determined from the individual images containing aliasing artifacts using said matrix. In other words the coil images are unfolded to form an overall image. SENSE therefore operates in the image space.

In contrast to SMASH (Sodickson, Manning: Simultaneous Acquisition of Spatial Harmonics (SMASH): Fast Imaging with Radiofrequency Coil Arrays, Magn. Res. Med., 38: 591-603, 1997), the measured measuring signals are combined linearly taking into account coil sensitivities to achieve modulation, as when switching a phase-encode gradient. The missing k-space data, in particular k-space lines, are therefore calculated. SMASH therefore operates in the k-space.

One version of this is Auto-SMASH (Jakob et al, AUTO-SMASH: a self-calibrating technique for SMASH imaging, MAGMA, 7: 42-54, 1998). One problem with SMASH is the determination of the coil sensitivity profiles. Therefore additional k-space lines, known as auto calibration signals (ACS), which are positioned at intermediate positions in the k-space, are recorded. The required coil weighting factors are determined by a fit between lines measured in the "standard" manner and ACS lines. There is therefore no need to determine the coil sensitivity profiles.

A further development of AUTO-SMASH, VD-AUTO-SMASH (Heidemann et al, Variable Density AUTO-SMASH (VD-AUTO-SMASH), Proceedings of the eighth Scientific Meeting of the International Society of Magnetic Resonance in Medicine, p. 274, 2000), uses the ACS lines.

With GRAPPA as well, the missing k-space lines are reconstructed before the image dataset is generated, so that a complete dataset is available for the creation of the image dataset. Here as well, the raw datasets have what are known as ACS lines or auto calibration signals for auto calibration in addition to the reduced dataset. In contrast to SMASH techniques however images can be obtained using a square sum reconstruction, thereby improving the SNR.

Should one wish to accelerate the methods cited in the introduction for generating a combination image using PPA methods, an intermediate step should be included, in which intermediate datasets are first generated from raw datasets, with a combination image dataset being determined therefrom. Depending on the PPA method the intermediate dataset may or may not have already undergone a Fourier transform. As described above, the raw datasets are incomplete in respect of foldover artifacts. In the present application the raw datasets acquired during a parallel recording are referred to as a parallel dataset.

A problem that occurs in this context is that during the creation of combination image datasets using parallel imaging artifacts such as what is known as a third arm artifact, spoiling or flow artifacts and even foldover artifacts occur.

SUMMARY OF THE INVENTION

An object of the present application is to provide a method for generating at least one combination image dataset from at least two parallel datasets, wherein the occurrence of artifacts in the combination image dataset is reduced.

This object is achieved by a method of the type mentioned in the introduction, with the following steps:
a) recording a first parallel dataset using a first parameter set,
b) recording at least one further parallel dataset using a further parameter set, c) reconstructing a first intermediate image dataset from the parallel dataset recorded using the first parameter set,
d) reconstructing at least one further intermediate image dataset from the further parallel dataset recorded using the further parameter set,
e) with at least one calibration data item of a raw dataset recorded using a first parameter set being used during the reconstruction of the further intermediate image dataset and/or at least one calibration data item of a raw dataset recorded using a further parameter set being used during the reconstruction of the first intermediate image dataset,
f) generating the combination image dataset by combining the first intermediate image dataset and the further intermediate image dataset or the further intermediate image datasets.

The core of the invention is that, when generating the intermediate image datasets, use is made not only of calibration data of the associated raw dataset but also of the raw dataset(s) recorded using the same coil, belonging to a different raw dataset. To reconstruct an intermediate dataset therefore data belonging to a different intermediate dataset is also used. This use of calibration data not associated with the intermediate dataset can improve the image quality of a combination image obtained from intermediate datasets.

Like the ACS lines described above calibration data is also necessary here for determining coil weighting factors or coil sensitivity information. This is obvious per se in conjunction with parallel imaging and is merely confirmed here.

The inventive method thus can be performed with AUTO-SMASH and methods derived therefrom as well as GRAPPA-based methods, as these use ACS lines.

In principle there is no restriction to a line-based procedure; spectroscopic imaging methods which are k-space point-based can also be used with parallel imaging. ACS points should then be used rather than ACS lines.

The "overall image" mentioned in the introduction in conjunction with PPA methods corresponds to an intermediate image dataset according to claim 1 from the processing stage. If an overall image as described above were combined with another image, it would also be deemed to be an "intermediate" image.

The first and a further intermediate image dataset can advantageously be combined by addition to form a combination image dataset. Alternatively the first and a further intermediate image dataset can be combined by subtraction to form a combination image dataset. When addition and/or subtraction is used as the combination method preferably only two, in other words a first and as the further a second, intermediate image datasets exist. The addition or subtraction here takes place image element by image element or pixel by pixel.

In a further alternative the intermediate image datasets can preferably be used pixel by pixel as an input value for any optimization method or separation method, in particular methods based on equation systems. Thus one pixel of the combination image dataset is obtained for each pixel of the intermediate image datasets.

It is preferable in all embodiments for all the parameter sets to be identical in respect of resolution, in other words for the number of image points in corresponding directions, the position of the read, phase and slice directions to correspond and for the FoV to be the same. There can however be differences in repetition time, echo time or even the measuring sequence. A measuring sequence here is a defined succession of RF pulses, gradients and wait times. The provision of a preliminary experiment, for example of an inversion pulse then results in a different measuring sequence. Simply changing wait times should not be seen as a change to the measuring sequence, although it may be in exceptional cases. Image contrasts may therefore always vary but resolution should not. It is however conceivable in principle to reduce the resolution of higher-resolution images to achieve an identical resolution in two image datasets. This is not done in practice, however, because of resulting difficulties such as changing SNR and resulting calculation problems.

At least three parallel datasets can advantageously be recorded using different parameter sets. The number of combined intermediate image datasets is in principle arbitrary. However at least one parameter of the intermediate image datasets must differ during recording or redundant information is obtained.

If there are at least three intermediate image datasets present, they can be combined by means of a regression calculation to form at least one combination image dataset. A linear or exponential fit in particular can be used as the regression calculation. The combination image dataset(s) is/are then the fit result. If the repetition time is varied in the parameter sets, a T1 fit can take place. Depending on whether a two or three parameter fit takes place, the combination image datasets obtained are a T1 map and a spin density image and in some instances an image for a constant. The fitting of the intermediate image datasets generally takes place image element-by-image element.

To record the parallel datasets parameter sets can advantageously be used, which only differ in respect of echo time or repetition time. The first parameter set therefore has any parameters and a first echo time, the second parameter set has identical measuring parameters and a second echo time, which is different from the first, etc. Of course only parameters of relevance for the measurement are taken into account here and not for example the time of the measurement. Something similar results for example when a spin echo sequence is recorded as a parallel dataset using a coil array and when the measurement is repeated only the echo time parameter is changed. This results in a number of image datasets, from which a T2 map can be obtained. In the case of turbo spin echoes for which the echo time is essentially defined as the echo time of the central k-space data point, in such a context echo time refers to the time when the echo is recorded between two refocusing pulses.

The echo times of the parameter sets can preferably be selected such that water and fat protons are sometimes in-phase and sometimes out-of-phase. This configuration is preferably linked to an addition and/or subtraction combination of the intermediate image datasets. In other words a preferred embodiment relates to the Dixon technique, with which the individual image datasets are obtained by means of parallel imaging.

A turbo spin echo sequence can advantageously be used as the sequence for recording the parallel datasets. Turbo spin echo sequences are also abbreviated to TSE or are also known as RARE. With these a number of refocusing pulses are used and a number of echoes a recorded in one pass. Phase encoding is varied between the echoes so the k-space is scanned.

A GRAPPA-based method are preferably used to reconstruct the intermediate image datasets. Such a method is known from DE 101 26 078 A1. In principle any reconstruction method that can take ACS data into account can be used. However a particularly high SNR can be obtained with GRAPPA.

Alternatively an Auto-SMASH-based method can be used to reconstruct the intermediate image datasets. The VD-AUTO-SMASH mentioned in the introduction also counts here.

A raw dataset can have a number of calibration data items forming a calibration line, the raw dataset comprising at least one calibration line. The more calibration lines there are available, the better the resulting SNR, but also the smaller the measuring time gain. At least one calibration line is preferably present.

At least one calibration data item, in particular a calibration line, can preferably be used as the mean value from a calibration data item of a raw dataset recorded using a first parameter set and a calibration data item of a raw dataset recorded using a further parameter set during the reconstruction of the first and/or a further intermediate image dataset. A single calibration line is formed here for all the raw datasets of a coil. The individual calibration data items can in turn be weighted and included in the mean value formation. If they are calibration lines, they are averaged element by element so that a line again results.

Alternatively the calibration lines or data can be inserted into the "external" raw datasets as if they were associated with the raw dataset. They can thus be lined up in the kx or ky direction.

The calibration data can particularly advantageously be weighted. It is then assumed that calibration data of both the raw dataset to be processed and also of at least one other raw dataset of the coil is used. The calibration lines are therefore not included one to one in the reconstruction. The weighting here can be performed as a function of a parameter of the parameter sets, in particular of the echo time. This ultimately means that one or more calibration data items of one or more raw datasets or parallel datasets can dominate more in the reconstruction of all the intermediate image datasets than others. In extreme instances, in particular where there are two parallel datasets, the calibration data of a single parallel dataset can be used to reconstruct both intermediate image datasets. There can therefore also be a weighting with the factor zero.

The weighting can also take place based on a k-space or image space-based analysis or by means of simulations or signal measurements, e.g. by determining the eddy current strength, instead of by means of the echo time.

Calibration data from a raw dataset, the echo time of which has been set "in-phase", can preferably be weighted more than calibration data from a raw dataset, the echo time of which has been set "out-of-phase". If the Dixon technique is executed in the manner of a fast Dixon technique, the calibration data of a raw dataset associated with the second echo can be weighted more than that associated with the first echo.

The object of the present invention is also achieved by a magnetic resonance system having a coil array and a control computer. The control computer is configured to operate the magnetic resonance system, including the scanner thereof, so as to perform the method as described above.

The implementation of the abovementioned methods in the control apparatus can take place here in the manner of software or in the manner of (permanently wired) hardware.

DESCRIPTION OF THE PREFERRED EMBODIMENTS

Figure 1:
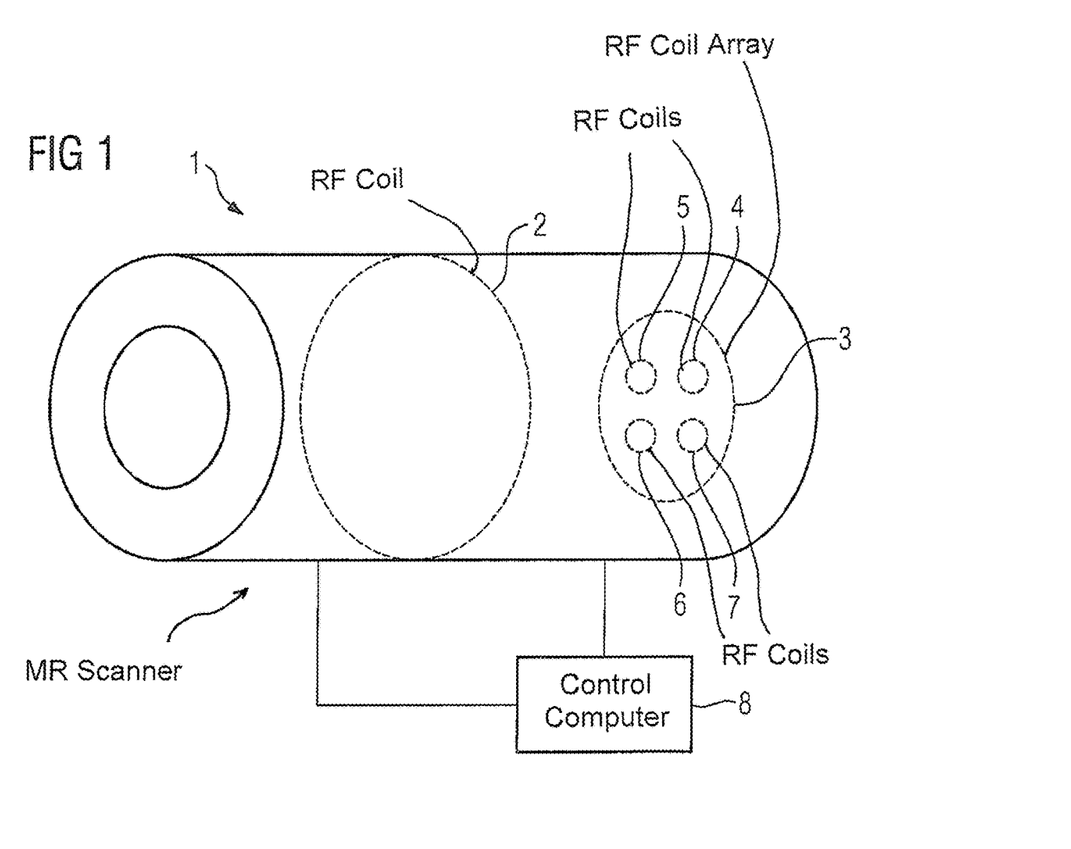
FIG. 1 shows a magnetic resonance system.

FIG. 1 shows a magnetic resonance scanner 1 with a radio-frequency (RF) coil 2 and an RF coil array 3 with RF coils 4, 5, 6 and 7 and a control computer 8.

The RF coil 2 is generally of the type known as a body coil. This is used to stimulate magnetization. In contrast, the RF coil array 3 is provided to read out the measuring signal. The RF coils 4, 5, 6 and 7 of the coil array 3 read out the measuring signal simultaneously.

Figure 2:
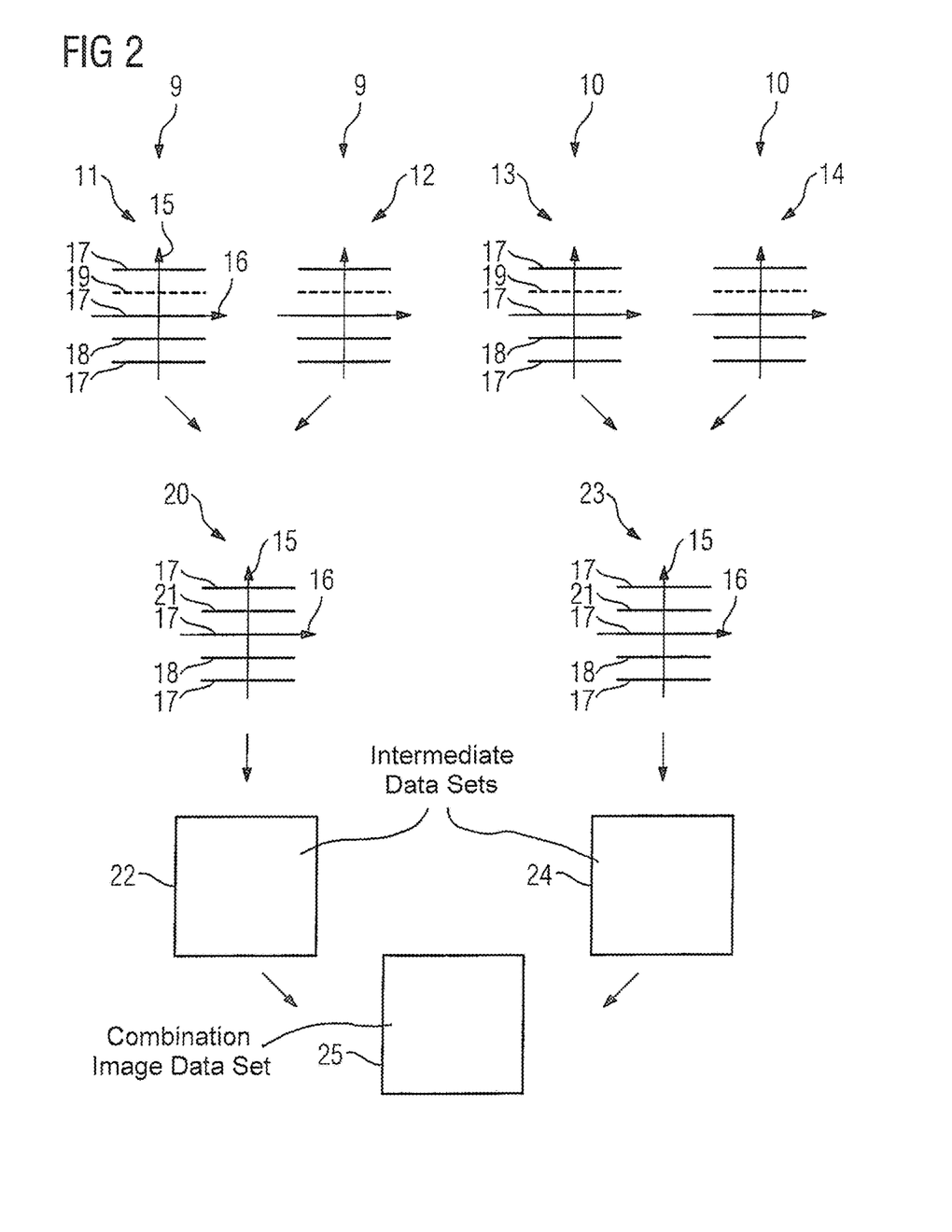
FIG. 2 shows a flow diagram (prior art).

FIG. 2 shows a known method for generating a combination image dataset with the Dixon technique using PPA methods. For clarity the use of just two coils, for example the coils 4 and 5, is assumed. Naturally any number of coils can be used.

The coils 4 and 5 are used to record a first parallel dataset 9 and a further, second parallel dataset 10. In this process the parallel dataset 9 is acquired first and then the parallel dataset 10. The raw datasets 11 and 12 are therefore recorded using the same, e.g. first, parameter dataset and the raw datasets 13 and 14 are recorded using another, e.g. second, parameter dataset. The raw datasets 11 and 13 were acquired for example with the coil 4 and the raw datasets 12 and 14 were acquired with the coil 5. The number of raw datasets of a parallel dataset is based on the number of coils in the coil array 3 here.

The raw datasets here are shown in the k-space diagram. The axis 15 represents the kx direction and the axis 16 the ky direction. Each raw dataset 11, 12, 13, and 14 has recorded k-space lines 17 and at least one calibration line 18, generally referred to as an ACS line. K space lines 19 that have been omitted during measurement and have to be reconstructed are shown broken.

For the raw datasets 12 and 14 the reference characters have been omitted for clarity. However the structure of the raw datasets 12 and 14 corresponds to that of the raw datasets 11 and 13, which were acquired using the same parameters apart from the echo time.

When two coils are used as the coil array, only one acceleration factor R=2 can be obtained and therefore only every second k-space line 19 can be omitted. If there are more coils correspondingly higher acceleration factors are possible. The calibration lines 18 are located at a point in the k-space, at which an omitted k-space line 19 should be located and as it were replace this according to the scan system.

The measured k-space lines 17 here form the reduced dataset. The respective raw dataset is formed together with the calibration line 18.

A GRAPPA method is used to obtain a reconstructed dataset 20 from the raw datasets 11 and 13, the reconstructed dataset 20 consisting of measured k-space lines 17, calibration lines 18 and reconstructed k-space lines 21. A Fourier transform is then used to obtain an intermediate image dataset 22 from the reconstructed dataset 20.

Further processing steps can of course also be performed such as baseline correction or zero filling.

A reconstructed dataset 23 is obtained from the raw datasets 12 and 14 and from this an intermediate image dataset 24 in the same manner. The intermediate image datasets 22 and 24 are then added or subtracted or otherwise combined to form a combination image dataset 25, depending on whether fat or water suppression is to take place.

The problem occurs that the combination image dataset 25 can contain flow, spoiling, and other artifacts.

Figure 3:
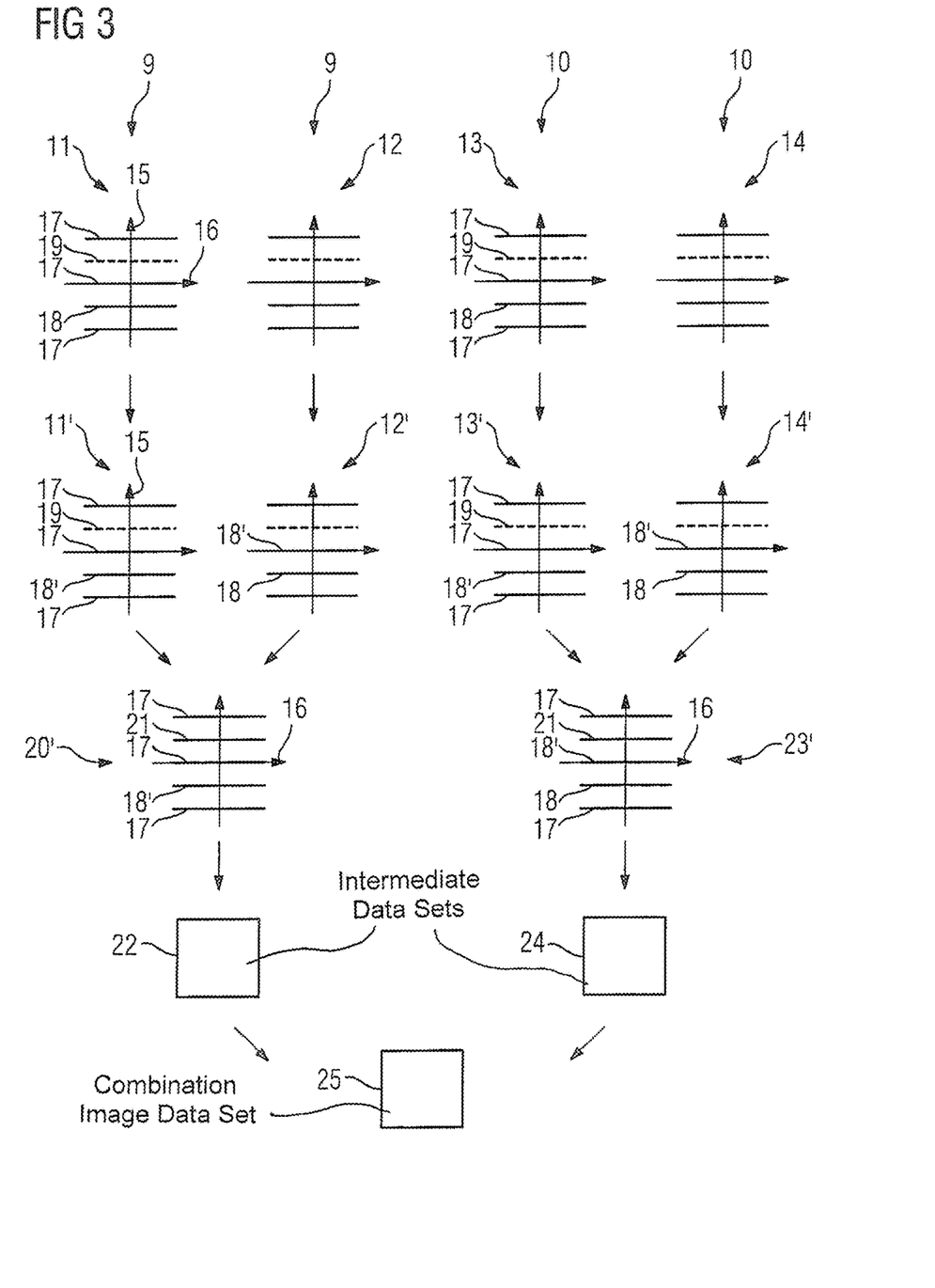
FIG. 3 shows a flow diagram.

FIG. 3 shows a flow which reduces the formation of such artifacts. Identical reference characters to those in FIG. 2 show identical objects. The recording of the measuring signals operates in the same manner as described in relation to FIG. 2.

In contrast to FIG. 2 an intermediate step is inserted so that calibration data of another parallel dataset is taken into account, resulting in the raw datasets 11', 12', 13' and 14'.

For example the calibration lines 18 of the raw datasets 11 and 13, which were recorded with the same coil but using different parameter sets, can be averaged to form a calibration line 18'. The calibration lines 18 here can be included with different weightings. However at the end the raw datasets 11' and 13' have the same calibration lines 18'. This can of course also be the case when there are a number of calibration lines 18, with calibration lines being averaged at the same point of the k-space in each instance.

The calibration lines 18 of another parallel dataset can be taken into account in an alternative manner in that they are inserted into another raw dataset. Thus the calibration line 18 of the raw dataset 13 can be inserted as the calibration line 18' into the raw dataset 11 and the calibration line 18 of the raw dataset 11 can be inserted as the calibration line 18' into the raw dataset 13. In fact this is only meaningful if more than one k-space line is omitted, as in the present example a measured k-space line 17 is then replaced. However this procedure is followed for the purpose of illustration.

Reconstructed datasets 20' and 23', the calibration lines 18' and also, depending on the way in which "external" calibration lines are taken into account, calibration lines 18 are obtained from the raw datasets 11', 12', 13' and 14' thus modified.

Either an averaging of calibration lines or an inclusion of the external calibration lines is always performed, in other words not a mixture as shown in FIG. 3. FIG. 3 is only intended to illustrate all the options.

The intermediate image datasets 22 and 24 and the combination image dataset 25 then result from the reconstructed datasets 20' and 23'.

Figure 4:
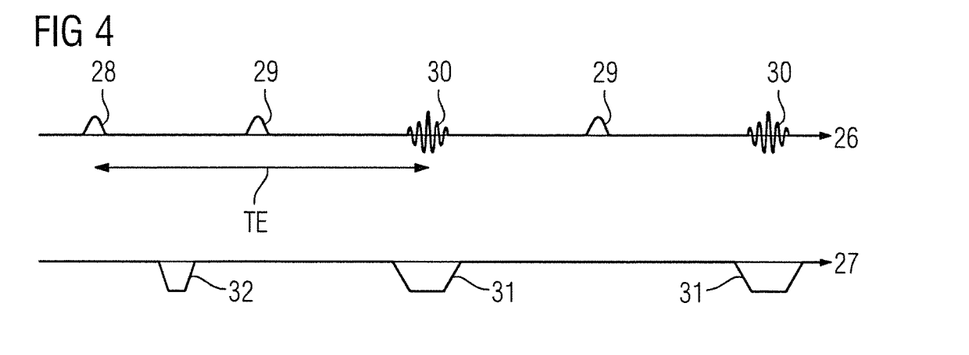
FIG. 4 shows a first sequence diagram.

FIG. 4 shows a first sequence diagram for the recording of a parallel dataset, for example of the parallel dataset 9. High-frequency pulses and signals are plotted on the axis 26 and the read gradient is plotted on the axis 27. Phase encode and slice gradients are not shown.

The sequence is configured as a TSE. In addition to an excitation pulse 28 there are therefore also two refocusing pulses 29. These produce two echo signals 30. While the echo signals 30 are being read out, the read gradients 31 are applied, while the gradient 32 is what is known as a "preread" gradient.

The phase encode gradient is transferred between the refocusing pulses 29 so that the echoes 30 cover different k-space lines.

The wait times are selected in such a manner between excitation pulse 28 and refocusing pulse 29 as well as refocusing pulse 29 and the echo maximum that the water and fat spins are "in-phase" at echo time TE.

Figure 5:
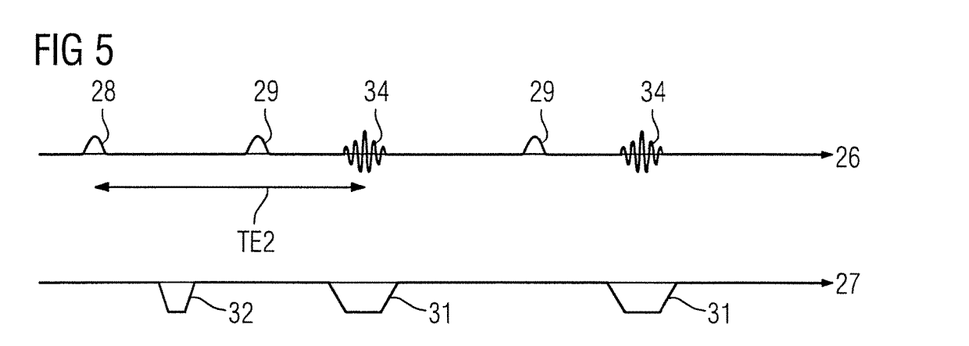
FIG. 5 shows a second sequence diagram.

FIG. 5 shows a second sequence diagram for the recording of a parallel dataset, for example of the parallel dataset 10. The only difference compared with the sequence diagram shown in FIG. 4 is the selection of the echo time between excitation pulse 28 and the first echo 34, so that the first echo signal 34 or at the time of the echo maxima the water and fat spins are "out-of-phase". The echo time is therefore marked as TE2. TE2 is shorter than TE.

Figure 6:
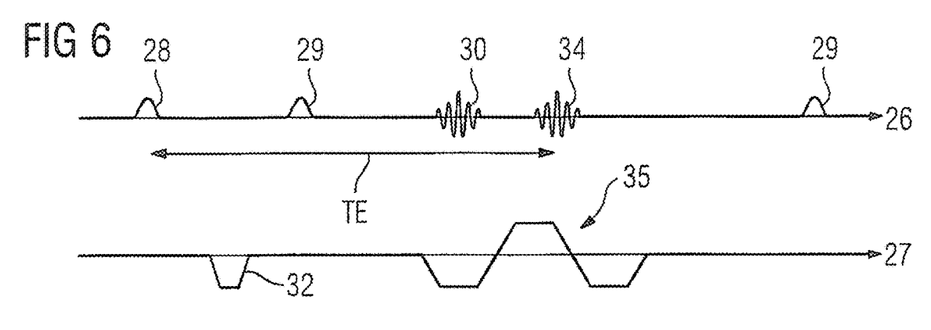
FIG. 6 shows a third sequence diagram.

FIG. 6 shows a third sequence diagram for the recording of two parallel datasets, e.g. of the parallel datasets 9 and 10. As an extension of FIG. 4 a bipolar read gradient 35 is applied so that after a first echo 30, in which the water and fat spins are "out-of-phase", a second echo 34 is generated, in which the water and fat spins are "in-phase". The "in-phase" echo here is located centrally between the refocusing pulses 29 and the "out-of-phase" echo is before or after. The recording of further k-space lines is suggested by the second refocusing pulse 29.

A summary of FIGS. 4 to 6 shows that the parallel datasets can be recorded one after the other or interleaved. Even though a frequency encoding is shown in FIGS. 4 to 6, it is also possible to use spectroscopic imaging methods which do not use frequency encoding when the signal is read out.

Figure 7:
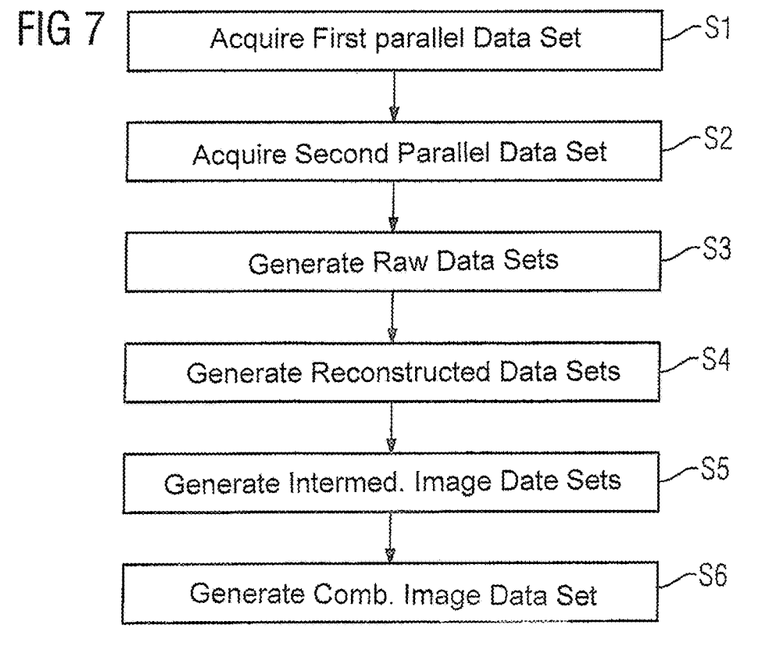
FIG. 7 is a flowchart for generating a combination image dataset.

FIG. 7 is a flowchart for generating a combination image dataset.

In step S1 a first parallel dataset is recorded (acquired), using a first parameter set. In step S2 a second or any number of further parallel datasets is/are recorded. Steps S1 and S2 can take place after one another or interleaved, for example as described in relation to FIGS. 4 to 6. In principle any known method can be used to generate parallel datasets, in other words any parallel imaging method in which calibration data ACS is generated. In a preferred example a Fast Dixon technique is used to acquire parallel datasets 9 and 10.

In step S3 raw datasets 11', 12', 13' and 14' are generated, with calibration data 18' being used, which is determined with the aid of calibration data from an "external" parallel image dataset of the "inherent" coil. In a raw dataset 11 for example the measured calibration line 18 is replaced by a calibration line 18', which results from combining the calibration lines 18 of the raw datasets 11 and 12, with both the raw dataset 11 and the raw dataset 12 having been acquired with the coil 4. It is thus possible to improve the image quality of the subsequently generated image datasets.

In the following step S4 a reconstructed dataset 20' and 23' is created for each parallel dataset 9 and 10 using a GRAPPA-based method. A Fourier transform produces intermediate image datasets 22 and 24 from these in step S5.

In step S6 the intermediate image datasets 22 and 24 are combined to form the combination image dataset 25. This takes place as an addition so that the combination image dataset 25 only represents a water signal or as a subtraction so that the combination image dataset is a pure fat image.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a magnetic resonance (MR) image with an MR scanner comprising a radio-frequency (RF) coil array comprising a plurality of individual RF coils, said method comprising:

in a control computer, generating control signals to the MR scanner in order to acquire the MR data from a subject as datasets respectively acquired in parallel, from an examination volume of the subject, with multiple RF coils among said plurality of RF coils, by acquiring a first parallel dataset with at least two of said RF coils with said MR scanner operated according to a first parameter set and by acquiring at least one further parallel dataset with said at least two of said RF coils with said MR scanner operated according to a second parameter set, each of said first and second parallel datasets comprising acquired data that are less than a total amount of data required to reconstruct an image of the examination volume, thereby requiring reconstruction using a calibration item to complete said total amount of data;

providing said control signals from said control computer to said MR scanner and thereby operating said MR scanner while said subject is situated in the scanner, so as to acquire said first parallel dataset from the subject with said at least two of said RF coils operated according to said first parameter set and so as to acquire said at least one further parallel dataset from the subject with said at least two of said RF coils operated according to said second parameter set, and thereby obtaining said first and second parallel datasets comprising acquired data that are less than said total amount of data required to reconstruct said image of the examination volume, and thereby requiring said reconstruction using said calibration item to complete said total amount of data;

providing said first and second parallel datasets to a processor and, in said processor, reconstructing a first intermediate image dataset and at least one further intermediate image dataset with at least one of (a) said first intermediate image dataset being reconstructed from said first parallel dataset using a calibration data item derived from said at least one further parameter set, and (b) said at least one further intermediate image dataset is reconstructed from said at least one further parallel dataset using a calibration data item derived from said first parameter set; and in said processor, generating a combination image dataset by combining said first intermediate image dataset and said at least one further intermediate dataset, and making said combination image dataset available at an output of said processor in electronic form as a data file.

2. A method as claimed in claim 1 comprising combining said first intermediate image dataset and said at least one further intermediate dataset to form said combination image dataset by addition.

3. A method as claimed in claim 1 comprising combining said first intermediate image dataset and said at least one further intermediate dataset to form said combination image dataset by subtraction.

4. A method as claimed in claim 1 comprising combining said first intermediate image dataset and said at least one further intermediate dataset to form said combination image dataset by an optimization method.

5. A method as claimed in claim 1 comprising operating said MR scanner to acquire at least three of said datasets of the examination volume of the subject in parallel.

6. A method as claimed in claim 5 comprising combining said first intermediate image dataset and said at least one further intermediate dataset to form said combination image dataset by a regression calculation.

7. A method as claimed in claim 6 comprising employing a linear fit or an exponential fit in said regression calculation.

8. A method as claimed in claim 1 comprising combining said first intermediate image dataset and said at least one further intermediate dataset to form said combination image dataset by a regression calculation.

9. A method as claimed in claim 1 wherein said first parameter set and said at least one further parameter set differ only with respect to echo time.

10. A method as claimed in claim 1 comprising selecting said first parameter set and said at least one further parameter set to have respective echo times to cause MR signals respectively originating from water protons and from fat protons to be acquired in-phase in one of said datasets and out-of-phase in another of said datasets.

11. A method as claimed in claim 1 comprising operating said MR scanner according to a turbo spin echo sequence to acquire said first dataset and said at least one further dataset in parallel.

12. A method as claimed in claim 1 comprising employing a GRAPPA-based method to reconstruct each of said first and second intermediate image datasets.

13. A method as claimed in claim 1 comprising employing a Auto-SMASH-based method to reconstruct each of said first and second intermediate image datasets.

14. A method as claimed in claim 1 comprising, when reconstructing said first and second intermediate image datasets, using a plurality of calibration data items that form a calibration line in each of said first and second intermediate image datasets.

15. A method as claimed in claim 1 comprising respectively weighting said calibration data items when reconstructing said first and second intermediate datasets.

16. A method as claimed in claim 15 comprising weighting said calibration data items as a function of a parameter in the respective first parameter set and said at least one further parameter set.

17. A method as claimed in claim 16 wherein said parameter is echo time.

18. A magnetic resonance (MR) apparatus comprising:
an MR scanner comprising a radio-frequency (RF) coil array comprising a plurality of individual RF coils;
a computer that operates the MR scanner so as to acquire MR data from a subject as datasets respectively acquired in parallel, from an examination volume of the subject, with multiple RF coils among said plurality of RF coils, by acquiring a first parallel dataset with at least two of said RF coils with said MR scanner operated according to a first parameter set and acquiring at least one further parallel dataset with said at least two of said RF coils with said MR scanner operated according to a second parameter set, each of said first and second parallel datasets comprising acquired data that are less than a total amount of data required to reconstruct an image of the examination volume, thereby requiring reconstruction using a calibration item to complete said total amount of data;
a processor provided with said first and second parallel datasets, said processor reconstructing a first intermediate image dataset and at least one further intermediate image dataset with at least one of (a) said first intermediate image dataset being reconstructed from said first parallel dataset using a calibration data item derived from said at least one further parameter set, and (b) said at least one further intermediate image dataset is reconstructed from said at least one further parallel dataset using a calibration data item derived from said first parameter set; and
said processor generating a combination image dataset by combining said first intermediate image dataset and said at least one further intermediate dataset, and making said combination image dataset available at an output of said processor in electronic form as a data file.

* * * * *